United States Patent
Kang et al.

(10) Patent No.: US 9,520,234 B2
(45) Date of Patent: Dec. 13, 2016

(54) MULTILAYER CERAMIC CAPACITOR, MANUFACTURING METHOD THEREOF AND BOARD FOR MOUNTING THE SAME THEREON

(71) Applicant: SAMSUNG ELECTRO-MECHANICS CO., LTD., Suwon, Gyunggi-do (KR)

(72) Inventors: Sim Chung Kang, Gyunggi-do (KR); Seung Hee Yoo, Gyunggi-do (KR); Jun Hyeong Kim, Gyunggi-do (KR); Eun Joo Choi, Gyunggi-do (KR); Kyu Ha Lee, Gyunggi-do (KR)

(73) Assignee: SAMSUNG ELECTRO-MECHANICS CO., LTD., Suwon, Gyunggi-Do (KR)

(*) Notice: Subject to any disclaimer, the term of this patent is extended or adjusted under 35 U.S.C. 154(b) by 4 days.

(21) Appl. No.: 14/099,650

(22) Filed: Dec. 6, 2013

(65) Prior Publication Data
US 2015/0068794 A1    Mar. 12, 2015

(30) Foreign Application Priority Data
Sep. 12, 2013  (KR) .................. 10-2013-0109700

(51) Int. Cl.
*H01G 4/232*  (2006.01)
*H01G 4/30*   (2006.01)
(Continued)

(52) U.S. Cl.
CPC ............ *H01G 4/232* (2013.01); *H01G 4/2325* (2013.01); *H01G 4/30* (2013.01); *H01G 4/12* (2013.01);
(Continued)

(58) Field of Classification Search
USPC ..................... 361/306.1, 303, 305
See application file for complete search history.

(56) References Cited

U.S. PATENT DOCUMENTS 6,046,902 A * 4/2000 Nakagawa ............. H01G 4/228
                                                 361/306.1
6,661,639 B1 * 12/2003 Devoe et al. ................ 361/303
(Continued)

FOREIGN PATENT DOCUMENTS

KR   10-2005-0102767 A   10/2005
KR   10-2010-0110891 A   10/2010
(Continued)

OTHER PUBLICATIONS

S. Iijima, Helical microtubules of graphitic carbon, Nov. 7, 1991, Nature, vol. 354, 56-58.*

(Continued)

*Primary Examiner* — Jeremy C Norris
*Assistant Examiner* — Muhammed Azam
(74) *Attorney, Agent, or Firm* — McDermott Will & Emery LLP (57) ABSTRACT

A multilayer ceramic capacitor and manufacturing method therefor, in which the capacitor includes a ceramic body including dielectric layers and internal electrodes; electrode layers connected to the internal electrodes; and a conductive resin layer formed on the electrode layers and including a first conductor, a second conductor having a fiber shape, and a base resin.

16 Claims, 6 Drawing Sheets

(51) Int. Cl.
*H01G 4/12* (2006.01)
*H05K 3/34* (2006.01)

(52) U.S. Cl.
CPC ... *H05K 3/3442* (2013.01); *H05K 2201/10015* (2013.01); *H05K 2201/10636* (2013.01); *Y02P 70/611* (2015.11); *Y10T 29/43* (2015.01)

(56) References Cited

U.S. PATENT DOCUMENTS

| | | | |
|---|---|---|---|
| 6,665,169 B2* | 12/2003 | Tennent et al. | 361/303 |
| 7,002,234 B2* | 2/2006 | Aisenbrey | B29C 45/0013 257/532 |
| 7,035,080 B1* | 4/2006 | Devoe | H05K 1/0231 361/303 |
| 7,304,831 B2* | 12/2007 | Yoshii | H01G 4/2325 361/306.1 |
| 7,310,217 B2* | 12/2007 | Takashima | H01G 4/385 361/306.1 |
| 7,558,047 B2* | 7/2009 | Ukuma | 361/305 |
| 8,125,765 B2* | 2/2012 | Ishida | H01G 4/012 361/303 |
| 8,797,708 B2* | 8/2014 | Sakuratani | H01L 41/273 361/303 |
| 8,988,850 B1* | 3/2015 | Kodama | H01G 4/232 361/301.4 |
| 9,330,842 B2* | 5/2016 | Sakuratani | H01G 4/005 |
| 9,330,847 B2* | 5/2016 | Jun | H01G 4/2325 |
| 2004/0029706 A1* | 2/2004 | Barrera et al. | 501/99 |
| 2004/0189170 A1* | 9/2004 | Aisenbrey | C09K 11/08 313/248 |
| 2007/0177331 A1* | 8/2007 | Das | H01G 4/206 361/306.1 |
| 2010/0302704 A1* | 12/2010 | Ogawa et al. | 361/306.3 |
| 2011/0090665 A1† | 4/2011 | Korony et al. | |
| 2011/0132637 A1* | 6/2011 | Otani et al. | 174/126.1 |
| 2011/0141657 A1* | 6/2011 | Jeon et al. | 361/321.1 |
| 2011/0299221 A1* | 12/2011 | Higashi | H01C 1/142 361/305 |
| 2012/0080209 A1† | 4/2012 | McLinn et al. | |
| 2012/0328944 A1* | 12/2012 | Tsukagoshi | H01M 4/1399 429/213 |
| 2013/0127588 A1† | 5/2013 | Korony et al. | |
| 2013/0141836 A1* | 6/2013 | Saito | H01G 2/103 361/306.1 |
| 2013/0170095 A1* | 7/2013 | Oh | H01G 4/008 361/305 |
| 2013/0242456 A1* | 9/2013 | Lee | H01G 4/008 361/301.4 |
| 2013/0250472 A1* | 9/2013 | Lee | H01G 4/12 361/301.4 |
| 2014/0043724 A1* | 2/2014 | Kang | H01G 4/30 361/321.2 |
| 2014/0063683 A1* | 3/2014 | Gu | H01G 4/30 361/301.4 |
| 2014/0116766 A1* | 5/2014 | Jeon | H05K 3/3442 174/260 |
| 2014/0160627 A1* | 6/2014 | Kobayashi | H01G 4/30 361/303 |
| 2014/0204502 A1* | 7/2014 | Chun | H01G 4/30 361/301.4 |
| 2014/0211368 A1* | 7/2014 | Fujii | H01G 4/012 361/301.4 |
| 2014/0233147 A1* | 8/2014 | Hong | H01G 4/008 361/301.4 |
| 2014/0345927 A1* | 11/2014 | Itagaki | H01G 2/065 174/260 |
| 2014/0373324 A1* | 12/2014 | Hamanaka | H01G 4/232 29/25.42 |
| 2015/0022945 A1* | 1/2015 | Park | H01G 4/2325 361/301.4 |
| 2015/0077898 A1* | 3/2015 | Chung | H01G 4/30 361/301.4 |
| 2015/0085422 A1* | 3/2015 | Kim | H01G 4/2325 361/301.4 |
| 2015/0090483 A1* | 4/2015 | Moon | H01G 4/30 174/260 |
| 2015/0092316 A1* | 4/2015 | Chun | H01G 4/30 361/301.4 |
| 2015/0170786 A1* | 6/2015 | Hong | H01B 1/02 174/260 |
| 2015/0187500 A1* | 7/2015 | Kang | H01G 4/30 174/260 |
| 2015/0213953 A1* | 7/2015 | Jun | H01G 4/2325 361/301.4 |
| 2015/0223834 A1* | 8/2015 | Richard | A61B 17/3421 600/204 |
| 2015/0279566 A1* | 10/2015 | Otani | H01G 4/30 361/301.4 |
| 2015/0364256 A1* | 12/2015 | Zenzai | C09D 5/24 361/301.4 |
| 2016/0020028 A1* | 1/2016 | Katsuta | H01G 4/0085 361/301.4 |
| 2016/0086733 A1* | 3/2016 | Saito | H01G 4/0085 361/301.4 |
| 2016/0093442 A1* | 3/2016 | Nagamoto | H01G 4/30 361/301.4 |
| 2016/0099110 A1* | 4/2016 | Lee | H01G 4/30 361/301.4 |
| 2016/0141103 A1* | 5/2016 | Hamanaka | H01G 4/012 361/301.4 |
| 2016/0172108 A1* | 6/2016 | Ikeda | H01G 4/2325 361/301.4 |
| 2016/0172110 A1* | 6/2016 | Otani | H01G 4/30 361/301.4 |
| 2016/0212850 A1* | 7/2016 | Kainuma | H05K 1/181 |

FOREIGN PATENT DOCUMENTS

| | | | | |
|---|---|---|---|---|
| KR | 10-2011-0067509 A | | 6/2011 | |
| WO | WO 9410697 | * | 5/1994 | H01G 1/147 |

OTHER PUBLICATIONS

Yi Li, Daniel Lu and C.P. Wong; Electrical Conductive Adhesives With Nanotechnologies; Section No. 4.9, all pages; Springer Copyright 2010; 10.1007/978-0-387-88783-8.†

Mark Stewart; "AVX MLCC FLEXITERMTM: Guarding Against Capacitor Crack Failures"; Abstract page, pp. 1-4, back page; published Jan. 2005.†

\* cited by examiner
† cited by third party

MULTILAYER CERAMIC CAPACITOR, MANUFACTURING METHOD THEREOF AND BOARD FOR MOUNTING THE SAME THEREON

CROSS-REFERENCE TO RELATED APPLICATION

This application claims the benefit of Korean Patent Application No. 10-2013-0109700 filed on Sep. 12, 2013, with the Korean Intellectual Property Office, the disclosure of which is incorporated herein by reference.

BACKGROUND

The present disclosure relates to a multilayer ceramic capacitor, a manufacturing method thereof, and a board having the same mounted thereon.

Among ceramic electronic components, a multilayer ceramic capacitor includes a plurality of stacked dielectric layers, internal electrodes opposed to each other, having the dielectric layer interposed therebetween, and external electrodes electrically connected to the internal electrodes.

Multilayer ceramic capacitors have been widely used as components in mobile communications devices such as laptop computers, personal digital assistants (PDAs), mobile phones, and the like, due to advantages thereof such as a small size, high capacitance, ease of mounting, or the like.

Recently, as electronic products have been miniaturized and multi-functionalized, chip components have also tended to be miniaturized and multi-functionalized. As a result, there is a need to miniaturize multilayer ceramic capacitors and increase the capacity thereof.

To this end, a multilayer ceramic capacitor in which thicknesses of dielectric layers and internal electrode layers are reduced and thus, an increased amount of the dielectric layers are stacked has been manufactured, and external electrodes thereof have also been thinned.

In addition, as many functions of devices requiring high reliability, such as automobiles or medical devices, are digitalized and demands thereof are increased, requirements have also been made for a multilayer ceramic capacitor to have high reliability in accordance with the demands.

Factors deteriorating high reliability may include a plating solution infiltration generated during a process, crack occurrence due to external impacts, and the like.

In order to solve the above-described defects, a resin composition containing a conductive material is applied to an electrode layer of the external electrodes to absorb external impacts and prevent a plating solution from being infiltrated into the electrode, thereby improving reliability.

However, in the case in which a conductive resin layer is applied to the electrode layer, equivalent series resistance (ESR) is increased, and therefore, a multilayer ceramic capacitor having improved ESR characteristics has been demanded.

RELATED ART DOCUMENT (Patent Document 1) Korean Patent Laid-Open Publication No. 2005-0102767

SUMMARY

An aspect of the present disclosure may provide a multilayer ceramic capacitor capable of having reduced equivalent series resistance (ESR) while absorbing external impacts and preventing a plating solution from being infiltrated thereinto, a manufacturing method thereof, and a board for mounting the multilayer ceramic capacitor thereon.

According to an aspect of the present disclosure, a multilayer ceramic capacitor may include: a ceramic body including dielectric layers and internal electrodes; electrode layers connected to the internal electrodes; and a conductive resin layer formed on the electrode layers and including a first conductor, a second conductor having a fiber shape, and a base resin.

The first conductor may have at least one of a spherical shape and a flake shape.

The second conductor may be flexible.

When a diameter of the second conductor is defined as D and a length of the second conductor is defined as L, $L/D \geq 1.0$ may be satisfied.

When a diameter of the second conductor is defined as D, $1\ nm \leq D \leq 100\ nm$ may be satisfied.

The second conductor may be a carbon nanotube.

The second conductor may be a single-walled carbon nanotube (SWNT).

The second conductor may be a multi-walled carbon nanotube (MWNT).

The base resin may be a thermosetting resin.

The multilayer ceramic capacitor may further include a plating layer formed on the conductive resin layer.

According to another aspect of the present disclosure, a manufacturing method of a multilayer ceramic capacitor may include: forming a ceramic body including dielectric layers and internal electrodes; forming a ceramic body including dielectric layers and internal electrodes; forming electrode layers to be connected to the internal electrodes; applying a conductive paste including a first conductor, a second conductor having a fiber shape, and a base resin to the electrode layers; and curing the conductive paste to form a conductive resin layer.

According to another aspect of the present disclosure, aboard for mounting a multilayer ceramic capacitor thereon may include: a printed circuit board having first and second electrode pads disposed thereon; and a multilayer ceramic capacitor installed on the printed circuit board, wherein the multilayer ceramic capacitor includes a ceramic body including dielectric layers and internal electrodes; electrode layers connected to the internal electrodes; and a conductive resin layer formed on the electrode layers and including a first conductor, a second conductor having a fiber shape, and a base resin.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Exemplary embodiments of the present disclosure will now be described in detail with reference to the accompanying drawings.

Multilayer Ceramic Capacitor

Figure 1:
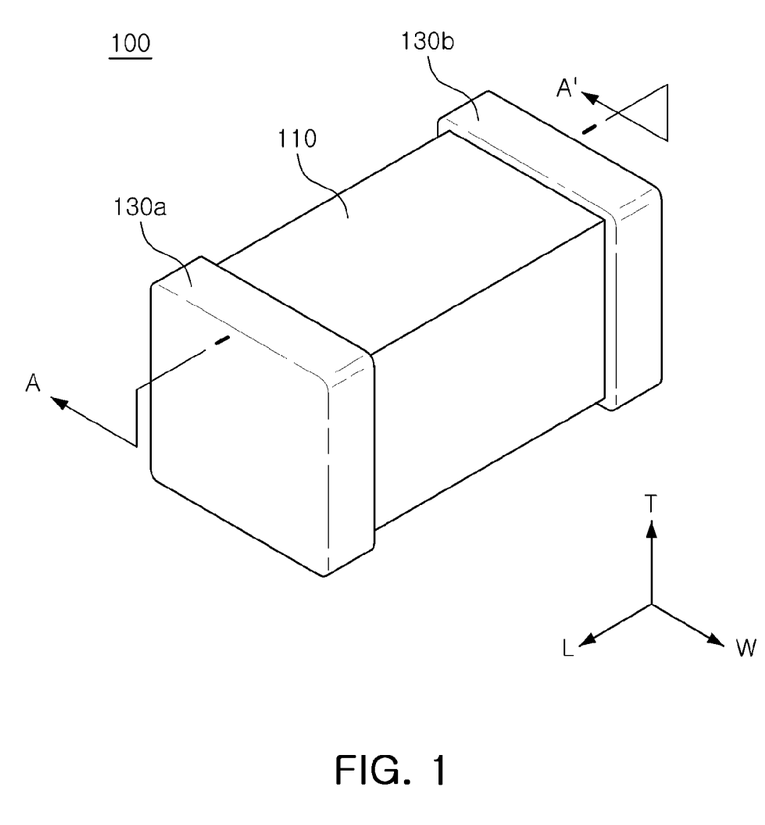
FIG. 1 is a perspective view showing a multilayer ceramic capacitor according to an exemplary embodiment of the present disclosure.
Figure 2:
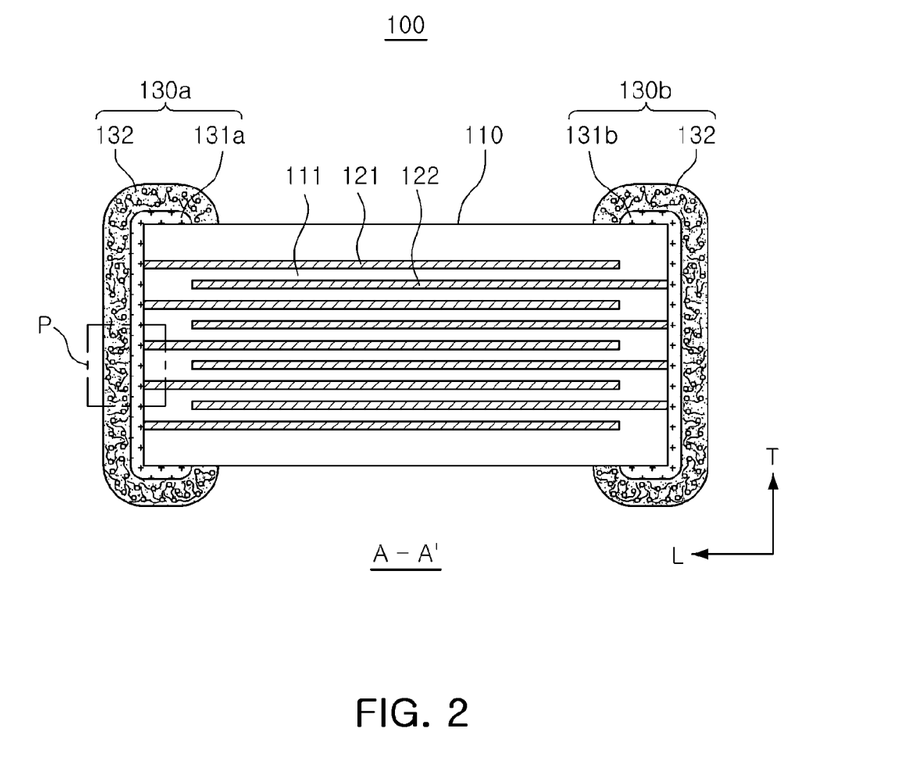
FIG. 2 is a cross-sectional view taken along line A-A' of FIG. 1.

FIG. 1 is a perspective view showing a multilayer ceramic capacitor 100 according to an exemplary embodiment of the present disclosure, and FIG. 2 is a cross-sectional view taken along line A-A' of FIG. 1.

Figure 3:
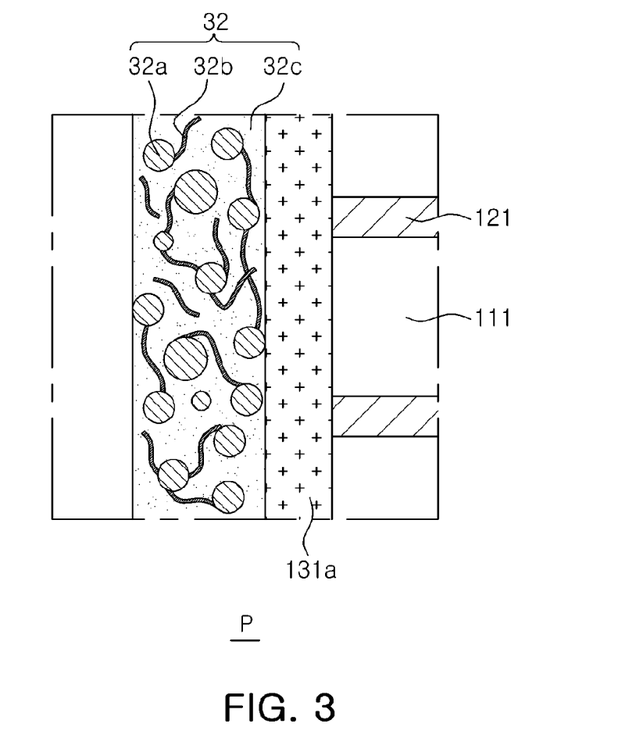
FIG. 3 is an enlarged view of region P of FIG. 2.

FIG. 3 is an enlarged view of region P of FIG. 2.

Referring to FIGS. 1 and 2, the multilayer ceramic capacitor 100 according to the exemplary embodiment of the present disclosure may include a ceramic body 110 and external electrodes 130a and 130b.

The ceramic body 110 may include an active layer as a part contributing to capacitance formation of the capacitor and upper and lower cover layers formed on upper and lower parts of the active layer as upper and lower margin parts, respectively. The active layer may include dielectric layers 111 and internal electrodes 121 and 122.

In the exemplary embodiment of the present disclosure, the ceramic body 110 may have a substantially hexahedral shape, but is not particularly limited in view of a shape. Due to sintering shrinkage of a ceramic powder at the time of sintering a chip, a difference in thickness depending on the presence or absence of internal electrode patterns, and abrasion of an edge part of the ceramic body, the ceramic body 110 may not have a complete hexahedral shape, but may have a shape similar to the hexahedral shape.

Hexahedral directions will be defined in order to clearly describe the exemplary embodiments of the present disclosure. L, W and T shown in the drawings refer to a length direction, a width direction, and a thickness direction, respectively. Here, the thickness direction may be used as the same meaning as a direction in which the dielectric layers are stacked.

The internal electrodes 121 and 122 may include first internal electrodes 121 and second internal electrodes 122, and the first and second internal electrodes may be disposed to face each other, having the dielectric layers 111 therebetween. The first and second internal electrodes 121 and 122, pairs of electrodes having different polarities, may be formed in a stacking direction of the dielectric layers 111 to be alternately exposed through both end surfaces of the ceramic body by printing a conductive paste including a conductive metal on the dielectric layers 111 at a predetermined thickness, and may be electrically insulated from each other by the dielectric layers 111 disposed therebetween.

That is, the first and second internal electrodes 121 and 122 may be electrically connected to the external electrodes 130a and 130b through portions thereof alternately exposed to the both end surfaces of the ceramic body 110. More specifically, the external electrodes may include the first external electrode 130a and the second external electrode 130b, and the first internal electrodes may be electrically connected to the first external electrode 130a and the second internal electrodes may be electrically connected to the second external electrode 130b, respectively.

Therefore, in the case in which voltage is applied to the first and second external electrodes 130a and 130b, electric charges are accumulated between the first and second internal electrodes 121 and 122 facing each other. Here, capacitance of the multilayer ceramic capacitor 100 is in proportion to an area of a region in which the first and second internal electrodes 121 and 122 are overlapped with each other.

Thicknesses of the first and second internal electrodes 121 and 122 may be determined depending on a usage thereof.

In addition, the conductive metal included in the first and second internal electrodes 121 and 122 may be nickel (Ni), copper (Cu), palladium (Pd), or alloys thereof, but the present disclosure is not limited thereto.

Here, a thickness of the respective dielectric layers 111 may be arbitrarily changed depending on a capacitance design of the multilayer ceramic capacitor.

In addition, the dielectric layers 111 may include a ceramic powder having a high dielectric constant, for example, a barium titanate ($BaTiO_3$)-based powder, or a strontium titanate ($SrTiO_3$)-based powder. However, the present disclosure is not limited thereto.

The upper and lower cover layers may be formed of the same material as that of the dielectric layers 111 and have the same configuration as that of the dielectric layers 111 except that they do not include the internal electrodes. The upper and lower cover layers may be formed by stacking a single dielectric layer or two or more dielectric layers on upper and lower surfaces of the active layer in a vertical direction, respectively, and basically serve to prevent damage to the first and second internal electrodes 121 and 122 due to physical or chemical stress.

The first external electrode 130a may include a first electrode layer 131a and a conductive resin layer 132, and the second external electrode 130b may include a second electrode layer 131b and the conductive resin layer 132.

The first and second electrode layers 131a and 131b may be directly connected to the first and second internal electrodes 121 and 122 to secure an electrical connection between the external electrodes and the internal electrodes.

The first and second electrode layers 131a and 131b may include a conductive metal, and the conductive metal may be nickel (Ni), copper (Cu), palladium (Pd), gold (Au), or alloys thereof, but the present disclosure is not limited thereto.

The first and second electrode layers 131a and 131b may be sintered electrodes formed by sintering the paste including the conductive metal.

The conductive resin layer 132 may be disposed on the first and second electrode layers 131a and 131b.

That is, the first and second electrode layers may be disposed on external surfaces of the ceramic body, and the conductive resin layer 132 may be formed on external surfaces of the first and second electrode layers.

In the specification of the present disclosure, based on the external electrodes, directions towards the ceramic body 110 are defined as inward directions, while directions away from the ceramic body 110 are defined as outward directions.

FIG. 3 is an enlarged view of region P of FIG. 2, and as shown in FIG. 3, the conductive resin layer 132 may include a first conductor 32a, a second conductor 32b, and a base resin 32c.

The first conductor 32a may include at least one of copper (Cu), silver (Ag), nickel (Ni), and alloys thereof, and may have a spherical shape or a flake shape.

The second conductor 32b may have conductivity and may have a fiber shape.

In the present disclosure, the fiber shape may be a thinly elongated shape, and mean a linear shape.

The second conductor may have a pillar shape of which the inside is solid or hollow. In addition, the second conductor may have a pipe shape having a passage formed therein.

The pillar shape may include all of a cylindrical shape and a polygonal pillar shape, and the pipe shape may include all of a circular pipe shape and a polygonal pipe shape.

That is, the fiber shape according to the exemplary embodiment of the present disclosure may collectively refer to a thinly elongated shape such as the pillar shape and the pipe shape as described above.

Figure 4:
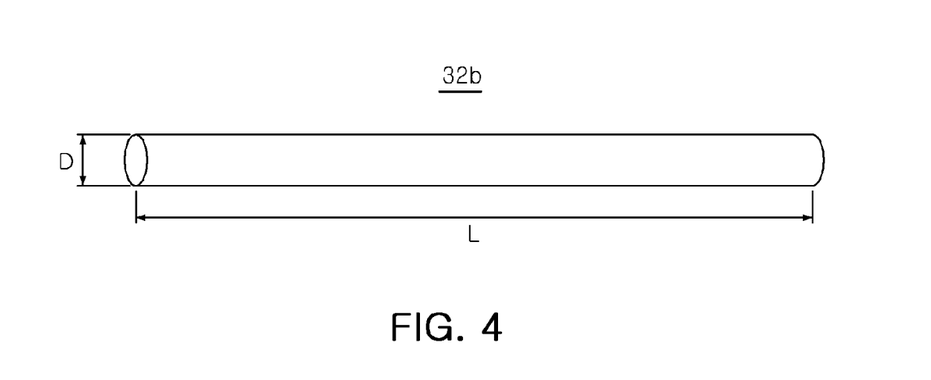
FIG. 4 is a schematic enlarged view showing a conductor having a fiber shape according to an exemplary embodiment of the present disclosure.

FIG. 4 is a schematic enlarged view showing a conductor having a fiber shape according to an exemplary embodiment of the present disclosure.

The second conductor according to the exemplary embodiment of the present disclosure may be flexible, and FIG. 4 is an enlarged view showing a state in which the second conductor is disposed in a straight line. The second conductor in the conductive resin layer may not be disposed as shown in FIG. 4 but may be freely disposed in a straight line or a curved line.

More specifically, the second conductor may include a carbon nanotube, and may include at least one of a single-walled carbon nanotube (SWNT) or a multi-walled carbon nanotube (MWNT).

The base resin 32C may be a thermosetting resin and may include an epoxy resin. However, the present disclosure is not limited thereto.

The conductive resin layer may be formed on the electrode layers to prevent a plating solution from being infiltrated into the electrode layers and the ceramic body and absorb physical impacts applied thereto from the outside, thereby protecting the multilayer ceramic capacitor.

Meanwhile, since the conductive resin layer includes the base resin, it may be defective in that an electrical conductivity is low as compared to the case of the electrode layers, sintered electrodes.

More specifically, since the conductive resin layer has a current flow generated by contact between conductors distributed in the base resin, or a tunneling effect, equivalent series resistance (ESR) may also be increased in accordance with an increase in the content of the resin.

In the case in which the content of the base resin included in the conductive resin layer is decreased and the content of the conductors is increased, an ESR value may be slightly decreased; however, functions capable of absorbing external impacts and preventing a plating solution from being infiltrated into the capacitor may be deteriorated.

However, the conductive resin layer may include the second conductor having the fiber shape according to the exemplary embodiment of the present disclosure, such that even in the case in which a predetermined amount of the base resin is included in the conductive resin layer in order to absorb external impacts and prevent a plating solution from being infiltrated into the capacitor, the conductive resin layer may have a decreased ESR value.

More specifically, since the second conductor having a fiber shape is distributed between the first conductors to improve contact between the first and second conductors, a current flow channel may be increased, such that ESR may be remarkably decreased.

In particular, in the case in which the second conductor having the fiber shape has a nano size, a filling rate of particles may be increased according to a bimodal system theory.

In addition, in the case in which the second conductor is flexible, contact between the first and second conductors may be further easily formed.

Referring to FIG. 4, according to the exemplary embodiment of the present disclosure, when a diameter of the second conductor is defined as D and a length of the second conductor is defined as L, the diameter D of the second conductor may satisfy $1\ nm \leq D \leq 100\ nm$.

In the case in which the diameter D of the second conductor is less than 1 nm, the second conductor included in a conductive resin paste may be broken during a dispersion process at the time of preparing the conductive resin layer, such that effects thereof as a conductor may be lost, while in the case in which the diameter D of the second conductor is greater than 100 nm, the filling rate of the conductive resin paste according to an increase of coarse linear solid particles may be deteriorated to decrease reliability of the multilayer ceramic capacitor.

According to the exemplary embodiment of the present disclosure, $L/D \geq 1.0$ may be satisfied. In the case in which L/D is less than 1.0, the current flow channel between first conductor particles due to the second conductor may not be sufficiently formed, such that an effect in which ESR is improved is insufficient.

In addition, according to the exemplary embodiment of the present disclosure, $L/D \geq 2$ may be satisfied.

According to the exemplary embodiment of the present disclosure, the second conductor may be a carbon nanotube.

The carbon nanotube, a fiber shaped conductor having a diameter on the nano-level, may have a significantly small volume as compared to a length thereof, such that even in the case in which the carbon nanotube is included in a small volume rate, the current flow channel (conductive channel) between the first conductor particles may be increased and the ESR may be decreased.

In addition, even in the case in which the carbon nanotube does not directly contact the first conductors, the carbon nanotube may be disposed between the first conductors to increase the channel through which electrons are transferred by the tunneling effect, such that the ESR may be effectively decreased.

Further, since the carbon nanotube may be flexible, the carbon nanotube may be effectively disposed between the first conductors having the spherical shape or the flake shape.

The conductive resin layer may include a plating layer (not shown) formed thereon. The plating layer may include a nickel plating layer and a tin plating layer, and the nickel plating layer may be disposed on the conductive resin layer and the tin plating layer may be disposed on the nickel plating layer.

According to the exemplary embodiment of the present disclosure, the conductive resin layer may include the first conductor having at least one of the spherical shape and the flake shape and the second conductor having the fiber shape, such that the multilayer ceramic capacitor having decreased ESR while absorbing external impacts and preventing a plating solution from being infiltrated thereinto may be provided.

Manufacturing Method of Multilayer Ceramic Capacitor

Figure 5:
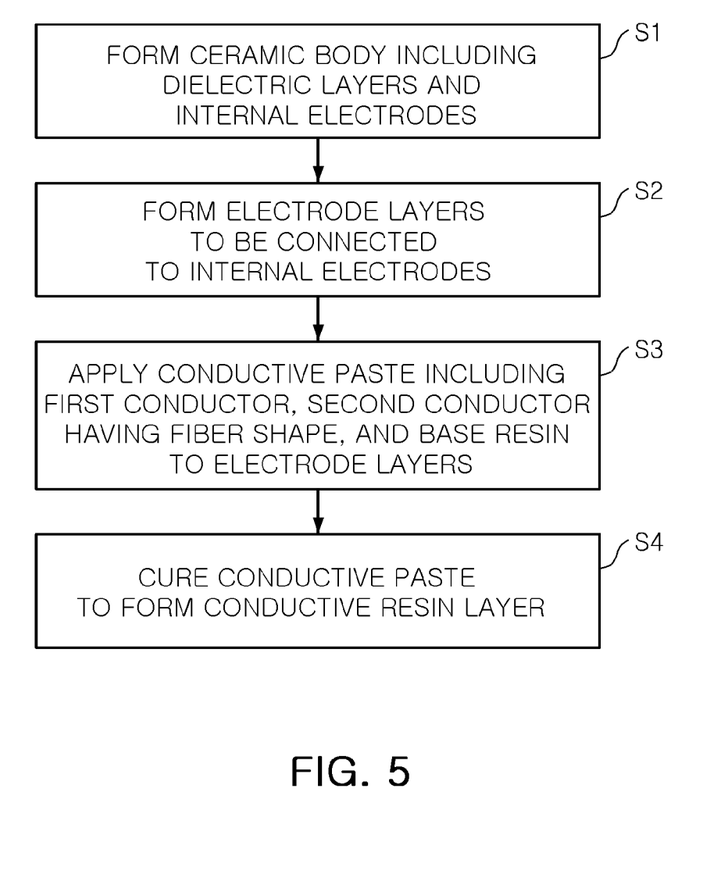
FIG. 5 is a manufacturing process view showing a manufacturing method of a multilayer ceramic capacitor according to another exemplary embodiment of the present disclosure.

FIG. 5 is a manufacturing process view showing a manufacturing method of a multilayer ceramic capacitor according to another exemplary embodiment of the present disclosure.

Referring to FIG. 5, the manufacturing method of multilayer ceramic capacitor according to the exemplary embodiment of the present disclosure may include: forming a ceramic body including dielectric layers and internal electrodes (S1); forming electrode layers to be connected to the internal electrodes (S2); applying a conductive paste including a first conductor, a second conductor having a fiber shape, and a base resin to the electrode layers (S3); and curing the conductive paste to form a conductive resin layer (S4).

A description of the manufacturing method of the multilayer ceramic capacitor according to the exemplary embodiment of the present disclosure, overlapped with that of the multilayer ceramic capacitor according to the foregoing exemplary embodiment of the present disclosure will be omitted.

In the manufacturing method of the multilayer ceramic capacitor according to the exemplary embodiment of the present disclosure, a slurry containing a powder such as a barium titanate ($BaTiO_3$) powder, or the like, was applied to carrier films and dried thereon to prepare a plurality of ceramic green sheets, such that dielectric layers and cover layers were formed.

The ceramic green sheets were manufactured by mixing a ceramic powder, a binder, and a solvent to prepare a slurry, and forming the slurry in sheet shapes each having a thickness designed by a doctor blade method.

Then, a conductive paste for an internal electrode including a metal powder was prepared.

After the conductive paste for the internal electrode was applied to the green sheets by a screen printing method to form internal electrodes, the plurality of green sheets having the internal electrodes printed thereon were stacked, and the plurality of green sheets having no internal electrodes printed thereon were stacked on upper and lower surfaces of a stacked body, and subjected to a sintering process, to thereby manufacture the ceramic body 110. The ceramic body 110 may include the internal electrodes 121 and 122, the dielectric layers 111, and the cover layers, and the dielectric layers may be formed by sintering the green sheets having the internal electrodes printed thereon and the cover layers may be formed by sintering the green sheets having no internal electrodes printed thereon.

The internal electrodes may include the first and second internal electrodes 121 and 122.

The electrode layers may be formed to be electrically connected to the internal electrodes.

More specifically, the first and second electrode layers 131a and 131b may be formed on the external surfaces of the ceramic body to be electrically connected to the first and second internal electrodes 121 and 122, respectively. The first and second electrode layers may be formed by sintering a paste including a conductive metal and glass.

The conductive metal may be at least one selected from a group consisting of copper (Cu), silver (Ag), nickel (Ni), and alloys thereof, but preferably, may be copper (Cu) as described above, but the present disclosure is not specifically limited.

The glass is not specifically limited, but may be a material having the same composition as that of glass used in manufacturing an external electrode of a general multilayer ceramic capacitor.

The conductive paste including the first conductor, the second conductor, and the base resin may be applied to external surfaces of the first and second electrode layers. The first conductor may have a spherical shape or a flake shape, and may include at least one of copper, silver, nickel, and alloys thereof, but is not limited thereto.

The second conductor may be flexible, and when a diameter of the second conductor is defined as D and a length of the second conductor is defined as L, $L/D \geq 1.0$ may be satisfied.

In addition, when a diameter of the second conductor is defiled as D, $1\ nm \leq D \leq 100\ nm$ may be satisfied.

The base resin may be an epoxy resin, a thermosetting resin.

The conductive resin layer may be formed by thermosetting the conductive paste.

In addition, the conductive resin layer may include a plating layer formed thereon.

Board for Mounting Multilayer Ceramic Capacitor Thereon

Figure 6:
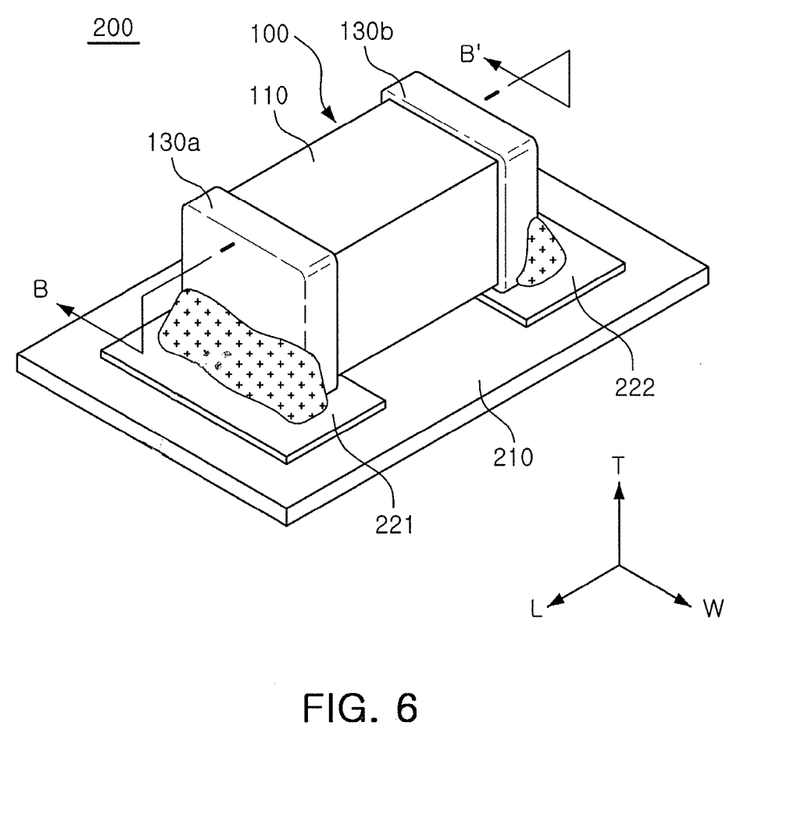
FIG. 6 is a perspective view showing a board for mounting a multilayer ceramic capacitor thereon according to another exemplary embodiment of the present disclosure.
Figure 7:
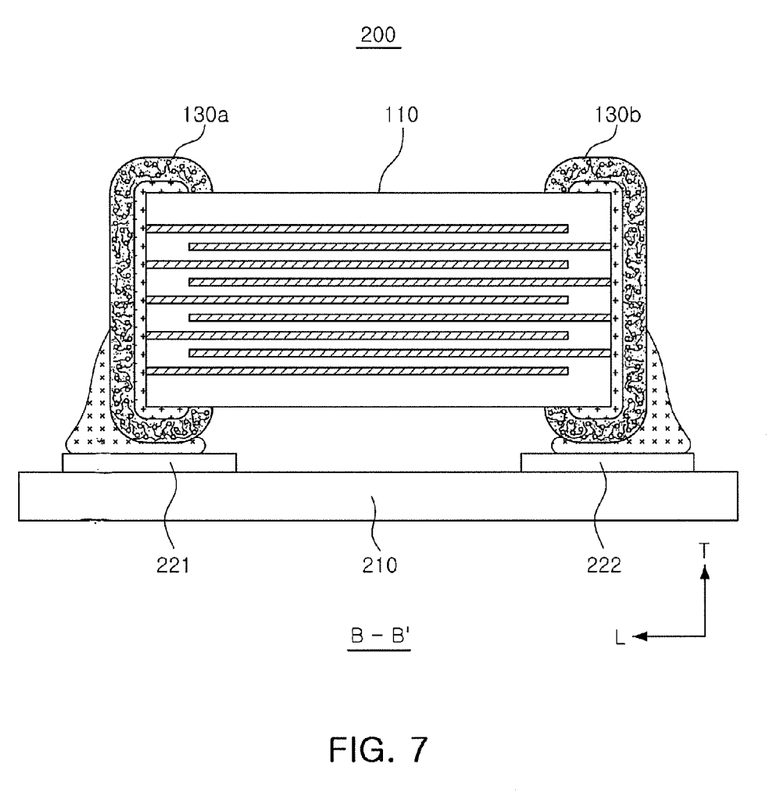
FIG. 7 is a cross-sectional view taken along line B-B' of FIG. 6.

FIG. 6 is a perspective view schematically showing a board for mounting a multilayer ceramic capacitor thereon according to another exemplary embodiment of the present disclosure, and FIG. 7 is a cross-sectional view taken along line B-B' of FIG. 6.

Referring to FIGS. 6 and 7, a board 200 for mounting a multilayer ceramic capacitor thereon according to another exemplary embodiment of the present disclosure may include: a printed circuit board 210 having first and second electrode pads 221 and 222 disposed thereon, and the multilayer ceramic capacitor 100 installed on the printed circuit board, wherein the multilayer ceramic capacitor may include the ceramic body 110 including dielectric layers and internal electrodes; electrode layers connected to the internal electrodes; and a conductive resin layer formed on the electrode layers and including a first conductor, a second conductor having a fiber shape, and a base resin.

Since a description of the multilayer ceramic capacitor 100 mounted on the printed circuit board 210 according to the exemplary embodiment of the present disclosure is overlapped with the foregoing description of the multilayer ceramic capacitor, the overlapped description thereof will be omitted.

Experimental Example

The following Table 1 shows variations in equivalent series resistance (ESR) depending on changes in ratios (L/D) of length to diameter of the second conductor included in the conductive resin layer of the multilayer ceramic capacitor.

TABLE 1

| L/D | Equivalent Series Resistance (mΩ) |
|---|---|
| 0.8 | 75.3 |
| 0.9 | 71.1 |
| 1 | 49.7 |
| 1.1 | 42.8 |
| 2 | 16.7 |
| 5 | 17.2 |

It may be appreciated from Table 1 above that in the case in which L/D was less than 1, ESR was 70Ω or more; however, in the case in which L/D was 1 or more, ESR was less than 50Ω, significantly decreased.

In addition, in the case in which L/D was 2 or more, ESR was largely decreased again. Therefore, in the case in which L/D was 2 or more, ESR of 20 mΩ or less was achieved.

As set forth above, according to exemplary embodiments of the present disclosure, a multilayer ceramic capacitor capable of having reduced equivalent series resistance (ESR) while absorbing external impacts and preventing a plating solution from being infiltrated thereinto, a manufacturing method thereof, and a board for mounting the multilayer ceramic capacitor thereon may be provided.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic capacitor comprising:
   a ceramic body including dielectric layers and internal electrodes forming capacitance;
   external electrode layers connected to the internal electrodes; and
   a conductive resin layer formed on the external electrode layers and including a first conductor, a second conductor having a fiber shape, and a base resin.

2. The multilayer ceramic capacitor of claim 1, wherein the first conductor has a spherical shape or a flake shape.

3. The multilayer ceramic capacitor of claim 1, wherein the second conductor is flexible.

4. The multilayer ceramic capacitor of claim 1, wherein L/D≥1.0, in which a diameter of the second conductor is defined as D and a length of the second conductor is defined as L.

5. The multilayer ceramic capacitor of claim 1, wherein 1 nm≤D≤100 nm, in which a diameter of the second conductor is defined as D.

6. The multilayer ceramic capacitor of claim 1, wherein the second conductor is a carbon nanotube.

7. The multilayer ceramic capacitor of claim 1, wherein the second conductor is a single-walled carbon nanotube (SWNT).

8. The multilayer ceramic capacitor of claim 1, wherein the second conductor is a multi-walled carbon nanotube (MWNT).

9. The multilayer ceramic capacitor of claim 1, wherein the base resin is a thermosetting resin.

10. The multilayer ceramic capacitor of claim 1, further comprising a plating layer formed on the conductive resin layer.

11. A manufacturing method of a multilayer ceramic capacitor, comprising:
    forming a ceramic body including dielectric layers and internal electrodes;
    forming electrode layers to be connected to the internal electrodes;
    applying a conductive paste including a first conductor, a second conductor having a fiber shape, and a base resin to the electrode layers; and
    curing the conductive paste to form a conductive resin layer.

12. A board for mounting a multilayer ceramic capacitor thereon comprising:
    a printed circuit board having first and second electrode pads disposed thereon; and
    a multilayer ceramic capacitor installed on the printed circuit board,
    wherein the multilayer ceramic capacitor includes
    a ceramic body including dielectric layers and internal electrodes forming capacitance;
    external electrode layers connected to the internal electrodes; and
    a conductive resin layer formed on the external electrode layers and including a first conductor, a second conductor having a fiber shape, and a base resin.

13. A multilayer ceramic capacitor comprising:
    a ceramic body including dielectric layers and internal electrodes;
    external electrode layers disposed on outer surfaces of the ceramic body and connected to the internal electrodes forming capacitance; and
    a conductive resin layer disposed on the external electrode layers and including a first conductive material, a second conductive material having a fiber shape different to shape of the first conductive material, and a base resin.

14. The multilayer ceramic capacitor of claim 13, wherein the first conductive material has a particle shape.

15. A manufacturing method of a multilayer ceramic capacitor, comprising: forming a ceramic body including a plurality of dielectric layers and internal electrodes; forming external electrode layers on the outer surfaces of the ceramic body to be connected to the internal electrodes;
    applying a conductive paste including a first conductive material, a second conductive material having a fiber shape different to shape of the first conductive material, and a base resin to the electrode layers; and
    curing the conductive paste to form a conductive resin layer.

16. The manufacturing method of a multilayer ceramic capacitor of claim 15, wherein the first conductive material has a particle shape.

* * * * *